(12) United States Patent
Kurita et al.

(10) Patent No.: US 9,486,879 B2
(45) Date of Patent: Nov. 8, 2016

(54) BONDING MATERIAL AND BONDING BODY, AND BONDING METHOD

(75) Inventors: Satoru Kurita, Tokyo (JP); Keiichi Endoh, Tokyo (JP); Yu Saito, Tokyo (JP); Yutaka Hisaeda, Tokyo (JP); Toshihiko Ueyama, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 199 days.

(21) Appl. No.: 13/988,387

(22) PCT Filed: May 13, 2011

(86) PCT No.: PCT/JP2011/061089
§ 371 (c)(1),
(2), (4) Date: Aug. 16, 2013

(87) PCT Pub. No.: WO2012/070262
PCT Pub. Date: May 31, 2012

(65) Prior Publication Data
US 2013/0323529 A1 Dec. 5, 2013

(30) Foreign Application Priority Data
Nov. 22, 2010 (JP) .................................. 2010-260617

(51) Int. Cl.
*B23K 35/00* (2006.01)
*B32B 15/00* (2006.01)
(Continued)

(52) U.S. Cl.
CPC ............. *B23K 31/02* (2013.01); *B22F 1/0014* (2013.01); *B22F 1/0062* (2013.01); *B23K 1/0016* (2013.01); *B23K 20/00* (2013.01); *B23K 35/025* (2013.01); *B32B 3/26* (2013.01); *B32B 15/018* (2013.01); *H01L 24/27* (2013.01); *H01L 24/29* (2013.01); *H01L 24/83* (2013.01); *B22F 1/0096* (2013.01); *B22F 2999/00* (2013.01);
(Continued)

(58) Field of Classification Search
None
See application file for complete search history.

(56) References Cited

U.S. PATENT DOCUMENTS 5,841,197 A * 11/1998 Adamic, Jr. ................. 257/777
8,540,903 B2 * 9/2013 Higuchi et al. ............ 252/520.1
(Continued)

FOREIGN PATENT DOCUMENTS

| JP | A-2002-126869 | 5/2002 |
| JP | A-2002-334618 | 11/2002 |

(Continued)

OTHER PUBLICATIONS

"Test methods for lead-free solders—Part 5: Methods for tensile tests and shear tests on solder joints", *Japanese Industrial Standard*, JIS Z 3198-5, 2003, pp. 1-8.
(Continued)

Primary Examiner — Devang R Patel
(74) Attorney, Agent, or Firm — Oliff PLC (57) ABSTRACT

There is provided a bonding material capable of forming a bonding body under an inert gas atmosphere such as a nitrogen atmosphere, and capable of exhibiting a bonding strength that endures a practical use even if not a heat treatment is applied thereto at a high temperature, which is the bonding material containing silver nanoparticles coated with a fatty acid having a carbon number of 8 or less and having an average primary particle size of 1 nm or more and 200 nm or less, and silver particles having an average particle size of 0.5 μm or more and 10 μm or less, and an organic material having two or more carboxyl groups.

8 Claims, 1 Drawing Sheet

(51) Int. Cl.
   *B23K 31/02*   (2006.01)
   *B23K 1/00*    (2006.01)
   *B23K 20/00*   (2006.01)
   *H01L 23/00*   (2006.01)
   *B22F 1/00*    (2006.01)
   *B23K 35/02*   (2006.01)
   *B32B 3/26*    (2006.01)
   *B32B 15/01*   (2006.01)

(52) U.S. Cl.
   CPC ............ *B23K2201/36* (2013.01); *H01L 24/05* (2013.01); *H01L 24/32* (2013.01); *H01L 2224/04026* (2013.01); *H01L 2224/05639* (2013.01); *H01L 2224/2732* (2013.01); *H01L 2224/27318* (2013.01); *H01L 2224/27505* (2013.01); *H01L 2224/2929* (2013.01); *H01L 2224/2939* (2013.01); *H01L 2224/2949* (2013.01); *H01L 2224/29294* (2013.01); *H01L 2224/29339* (2013.01); *H01L 2224/32225* (2013.01); *H01L 2224/83075* (2013.01); *H01L 2224/8384* (2013.01); *H01L 2224/83192* (2013.01); *H01L 2224/83204* (2013.01); *H01L 2224/83439* (2013.01); *H01L 2224/83801* (2013.01); *H01L 2224/83907* (2013.01); *H01L 2224/83986* (2013.01); *H01L 2924/01006* (2013.01); *H01L 2924/01029* (2013.01); *H01L 2924/01047* (2013.01); *H01L 2924/10253* (2013.01); *H01L 2924/12042* (2013.01); *H01L 2924/1301* (2013.01); *H01L 2924/1305* (2013.01); *H01L 2924/1306* (2013.01); *H01L 2924/13033* (2013.01); *H01L 2924/13055* (2013.01); *H01L 2924/13091* (2013.01); *H01L 2924/15747* (2013.01); *H01L 2924/203* (2013.01); *Y10T 428/12479* (2015.01)

(56) References Cited

U.S. PATENT DOCUMENTS

2001/0031828 A1* 10/2001 Honda ................... C09J 163/00
                                                           525/107
2002/0046627 A1*  4/2002 Amita ................ B23K 35/0244
                                                           75/252
2009/0091012 A1*  4/2009 Tateoka ............... C08G 73/106
                                                           257/676

FOREIGN PATENT DOCUMENTS

| JP | B2-4344001 | 7/2009 |
| JP | A-2009-267374 | 11/2009 |
| JP | A-2009-279649 | 12/2009 |
| JP | A-2010-53377 | 3/2010 |
| JP | A-2010-77266 | 4/2010 |
| JP | 2010153118 A * | 7/2010 |
| JP | A-2010-153118 | 7/2010 |
| WO | WO 2009/157309 A1 | 12/2009 |

OTHER PUBLICATIONS

International Search Report issued in International Application No. PCT/JP2011/061089 mailed Aug. 9, 2011.

Morita et al., "Development of a Lead-Free Bonding Technique for High Temperature Environment Using Silver Oxide Particles of Micrometer Size," *Materia Japan*, 2010, vol. 49, No. 1, pp. 20-22, 47.

* cited by examiner

BONDING MATERIAL AND BONDING BODY, AND BONDING METHOD

TECHNICAL FIELD

The present invention relates to a bonding material and a bonding body using the same, and a bonding method.

DESCRIPTION OF RELATED ART

An operation temperature of a semiconductor used for an inside of an electronic component is likely to be higher, with an increase of a current that flows through the electronic component used for an automobile and industrial equipment. Therefore, a bonding material capable of enduring a high temperature environment is requested in the electronic component. In response to such a request, a lead-containing solder has been used conventionally for maintaining a strength even at a high temperature. However, in recent years, there is a trend of inhibiting the use of lead, and therefore a bonding method not using the lead-containing solder is requested.

Use of a silver solder can be considered as a candidate of the bonding material and the bonding method capable of responding to such a request. However, a high temperature heating is required for a heat treatment operation. Meanwhile, a miniaturized and microfine electronic component has been developed, and a heating temperature during bonding operation is desired to be suppressed to be low. Under such a circumstance, a bonding material and a bonding method using silver nanoparticles are focused.

For example, non-patent document 1 and patent document 1 propose a method of mixing silver oxide particles and myristyl alcohol, to thereby obtain a bonding material, and patent document 2 proposes a method of adding carboxylic acid to a mixture of silver carbonate or silver oxide, and silver nanoparticles.

PRIOR ART DOCUMENT

Patent Document

Patent document 1:
Japanese Patent Laid Open Publication No. 2009-267374
Patent document 2:
Japanese Patent Laid Open Publication No. 2009-279649
Non-Patent Document
Non-patent document 1: "Development of a lead-free bonding technique for high temperature environment using silver oxide particles of micrometer size" by Morita, et al. produced by MATERIA Vol. 491 (2010)

SUMMARY OF THE INVENTION

Problem to be Solved by the Invention

As described in the above-mentioned patent documents, when a bonding body is formed using a bonding material of a conventional technique, the bonding operation is performed in an atmosphere of an oxygen-containing atmosphere.

It is found by inventors of the present invention, that silver derived from the bonding material that exists on an interface part of the bonding body is turned into silver oxide if the bonding operation is performed in the atmosphere, thus possibly having an adverse influence on a bonding force of the bonding material. Particularly, such an adverse influence seems to be remarkable in the bonding body having a fine structure.

Therefore, it is considered that the bonding operation is performed under an inert gas atmosphere such as a nitrogen atmosphere. However, when the bonding operation is performed in the inert gas atmosphere such as a nitrogen atmosphere, it is found that a sufficient strength cannot be obtained depending on a condition.

Further, it is also found that a hole is generated in a bonding layer (described as a void in some cases hereafter) when the bonding method of the conventional technique is used, and there is an influence not only on the bonding strength of the bonding body, but also on reliability of the bonding body.

In view of the above-mentioned circumstance, the present invention is provided, and an object of the present invention is to provide a bonding method and a bonding material capable of forming a bonding body even under an inert gas atmosphere such as a nitrogen atmosphere, and capable of inhibiting a generation of a void.

Means for Solving the Problem

In order to solve the above-described problem, after strenuous efforts by the inventors of the present invention, it is found that in a bonding operation, a strength that endures a practical use can be exhibited and generation of a void can be inhibited, by a bonding method of coating a bonding surface of a first bonded member with a bonding material, then applying thereto an auxiliary calcination, and thereafter disposing a second bonded member on a layer of the bonding material, and applying thereto a full calcination, to thereby form a bonding layer between the first bonded member and the second bonded member.

Then, the inventors of the present invention obtain a breakthrough knowledge as follows: bonding at 500° C. or less is enabled in an inert gas atmosphere such as a nitrogen atmosphere, by using a bonding material composed of at least silver nanoparticles, silver particles, flux, and a dispersion medium, using the silver nanoparticles coated with a fatty acid having a carbon number of 8 or less, using the silver particles having an average particle size of 0.5 μm to 10 μm, and using an organic material having two or more carboxyl groups as flux. Thus, the present invention is completed.

Namely, a first invention provides a bonding method of bonding a plurality of bonded members, including:

coating a bonding surface of a first bonded member with a bonding material;

applying auxiliary calcination to the first bonded member coated with the bonding material, by heating it to a prescribed temperature;

setting a second bonded member on a layer of the bonding material with which the heated first bonded member is coated; and applying full calcination to the first bonded member on which the second bonded member is set, by applying heat treatment thereto to a higher temperature than the temperature of the auxiliary calcination, to thereby form a bonding layer between the first bonded member and the second bonded member.

A second invention provides the bonding method according to the first invention, wherein the bonding material contains an organic material having two or more carboxyl groups.

A third invention provides the bonding method according to the first or second invention, wherein the bonding material contains silver nanoparticles with an average primary particle size of at least 1 nm or more and 200 nm or less.

A fourth invention provides the bonding method according to any one of the first to third inventions, wherein in performing the full calcination, pressurization of 20 MPa or less is added onto bonding surfaces of the first bonded member and the second bonded member.

A fifth invention provides a bonding material containing silver nanoparticles coated with a fatty acid having a carbon number of 8 or less and having an average primary particle size of 1 nm or more and 200 nm or less, and silver particles having an average particle size of 0.5 μm or more and 10μ or less, an organic material having two or more carboxyl groups, and a dispersion medium.

A sixth invention provides the bonding material according to the fifth invention, wherein the organic material having two or more carboxyl groups has an ether bond.

A seventh invention provides the bonding material according to the fifth or sixth invention, wherein the organic material having two or more carboxyl groups is an oxydiacetic acid.

An eighth invention provides the bonding material according to any one of the fifth to seventh invention, wherein the silver nanoparticles are coated with a fatty acid having a carbon number of 3 or more and 6 or less.

A ninth invention provides a bonding method for bonding a plurality of bonded members, including:

coating a bonding surface of a first bonded member with a bonding material of any one of claims 5 to 8;

applying auxiliary calcination to the first bonded member coated with the bonding material, by heating it to a prescribed temperature;

setting a second bonded member on a layer of the bonding material with which the heated first bonded member is coated; and applying full calcination to the first bonded member on which the second bonded member is set, by applying heat treatment thereto to a higher temperature than the temperature of the auxiliary calcination, to thereby form a bonding layer between the first bonded member and the second bonded member.

A tenth invention provides the bonding method according to any one of the first to fourth, ninth inventions, wherein the full calcination is performed in an inert gas atmosphere.

An eleventh invention provides the bonding method according to any one of the fourth, ninth, or the tenth invention, wherein the full calcination is performed at a temperature of 150° C. or more and 500° C. or less.

A twelfth invention provides the bonding method according to any one of the fourth, ninth, or the eleventh invention, wherein a rate of heating temperature rise is set to 0.1° C./second or more and 2.0° C./second or less in the full calcination.

A thirteenth invention provides a bonding body in which a plurality of bonded members are bonded by a bonding layer, wherein a ratio of a void that exists in this bonding layer is 2.0% or less.

Effect of the Invention

By using the bonding material of the present invention, a bonding body capable of exerting a practical bonding strength can be formed at 500° C. or less even under an inert gas atmosphere such as a nitrogen atmosphere. Further, according to the bonding method of the present invention, the generation of the void is inhibited in the formed bonding layer, and therefore the bonding body capable of exerting reliability and high strength can be obtained.

MODES FOR CARRYING OUT THE INVENTION

First, silver nanoparticles, silver particles, flux, and a dispersion medium that constitute a bonding material of the present invention will be described first in detail, and production of a bonding material (paste) and formation of a bonding body will be described next.

<Silver Nanoparticles>

Each silver nanoparticle constituting the bonding material of the present invention has an average primary particle size of 200 nm or less, preferably 1 to 150 nm, and further preferably 10 to 100 nm. By using the silver nanoparticles having this average particle size, the bonding body having a strong bonding force can be formed.

A surface of the silver nanoparticle constituting the bonding material of the present invention is coated with an organic material being a protective agent. The organic material is preferably a fatty acid having a total carbon number of 8 or less. Specifically, saturated fatty acids such as octanoic acid (caprylic acid), heptanoic acid (enanthic acid), hexanoic acid (caproic acid), pentanoic acid (valeric acid), butanoic acid (butyric acid), propanoic acid (propionic acid), etc., can be given. Further, dicarboxylic acids such as oxalic acid, malonic acid, methylmalonic acid, ethylmalonic acid, succinic acid, methylsuccinic acid, ethylsuccinic acid, phnylsuccinic acid, glutaric acid, adipic acid, pimelic acid, and suberic acid, etc., can be given. Also, unsaturated fatty acids such as sorbic acid and maleic acid, etc., can be given.

Particularly, hexanoic acid, heptanoic acid, adipic acid, sorbic acid, and malonic acid are preferable from a viewpoint of productivity and workability, and by coating the surface of the silver nanoparticle with the fatty acid, the silver nanoparticles in a powder form that suitably aggregates, can be obtained.

The silver nanoparticle with the surface coated with the fatty acid, can be easily recovered as an aggregate mass, while keeping a form of a primary particle as the silver nanoparticle. A particle size of the aggregate mass is at least 2.5 μm or more. This particle size can be confirmed because the aggregate mass can be recovered through No5C filter paper (JIS P-3801). Namely, if the aggregate mass (secondary aggregate) is filtered using the filter paper, filtrate becomes clear, and therefore it can be considered that the aggregate mass has a particle size of more than an aperture of this filter paper. Further, by applying drying operation to the recovery at a low temperature of (less than 100° C.), a dry powder composed of the aggregate mass of the silver nanoparticles can be obtained.

By forming the silver nanoparticles into a powder form, workability in mixing particles can be considerably improved when producing the bonding material of the present invention. Further, silver nanoparticles coated with a plurality of kinds of organic materials can also be used, or silver nanoparticles having different average primary particle size can also be used together. When the silver nanoparticles are used as the bonding material, the silver nanoparticles are preferably added at a percentage of 10 to 80 mass % and preferably 15 to 75 mass %, with respect to a total mass of a paste.

Here, the silver nanoparticles having the above-mentioned particle size can be produced by a method described in U.S. Pat. No. 4,344,001 for example. Such a production method will be simply described in an order of a liquid preparing step, a temperature rising step, a reaction step, an aging step, a filtering/washing step, and a drying step.

<<Liquid Preparing Step>>

A reducing liquid in which a substance having a reducibility is dissolved, and a raw material liquid in which a metal salt (particularly silver salt) being a raw material is dissolved, are prepared.

The reducing liquid is obtained by homogeneously mixing a reducing agent, a protective agent, and aqueous ammonia being a stabilizing agent. Here, the reducing agent capable of reducing metal is acceptable. For example, hydrazine hydrate, and further hydrazine, boron hydride alkali salt ($NaBH_4$), lithium aluminium hydride ($LiAlH_4$), ascorbic acid, primary amine, secondary amine, and tertiary amine, etc., can be used together.

As described above, the protective agent is an organic material that adheres to the surface of a silver particle to thereby inhibit the bond of particles, thus obtaining a stable fine silver particle. The organic material is preferably the fatty acid having a total carbon number of 8 or less, and particularly hexanoic acid and sorbic acid are suitably used.

The stabilizing agent is added for dissolving acid into water, and the aqueous ammonia can be used as the stabilizing agent.

A polar solvent is preferably used as a solvent, and water or an organic solvent having a polar group can be used. Specifically, water, alcohol, polyol, glycol ether, 1-methyl-pyrrolidinone, pyridine, terpineol, butyl carbitol, butyl carbitol acetate, texanol, phenoxy propanol, etc., can be given for example.

As described above, a mixture of water, aqueous hydrazine hydrate, hexanoic acid, and aqueous ammonia, can be given as a specific example of the reducing liquid, and aqueous silver nitrate can be given as a specific example of the raw material liquid.

<<Temperature Rising Step>>

Temperatures of the reducing liquid and a raw material liquid are raised to a reaction temperature. At this time, there is an effect of preventing heterogeneity of the reaction in a reaction process by similarly heating the reducing liquid and the raw material liquid, and homogeneity of particles can be preferably maintained. At this time, the temperature is raised in a range of 40 to 80° C.

<<Reaction Step>>

When the temperatures reach a target temperature in the reducing liquid and the raw material liquid, the raw material liquid is added into the reducing liquid. The raw material liquid is preferably added into the reducing liquid at once, with more attention to bumping.

<<Aging Step>>

After the reducing liquid and the raw material liquid are mixed, they are stirred about for 10 to 30 minutes, to thereby complete a growth of the particles.

<<Filtering/Washing Step>>

The obtained slurry is solid/liquid separated by a filtering method. Washing step is performed by adding pure water to a cake obtained in this filtering method, and filtering the pure water again. According to a producing method of the present invention, loose aggregates are formed by primary fine particles of nano-order, which are naturally precipitated into a reaction liquid, and therefore can be easily recovered.

<<Drying Step>>

A dry metal (silver) particle mass can be obtained by applying a drying step to the obtained metal (silver) mass at 60 to 90° C. for 6 to 24 hours.

<<Measurement/Evaluation of the Silver Nanoparticles>>

The particle size of each silver nanoparticle is calculated from a Transmission Electron Microscope (TEM) photograph.

Specifically, 2 pts.mass of metal nanoparticles are added into a mixed solution of 96 pts.mass of cyclohexane and 2 pts.mass of oleic acid, which are then dispersed by an ultrasonic wave, to thereby obtain a dispersion solution. The obtained dispersion solution is dropped onto a Cu microgrid with a supporting film and dried, to thereby create a TEM sample. The microgrid being the created TEM sample is observed using the Transmission Electron Microscope (JEM-100CX Mark-II by JEOL), wherein an image of observing the particles in a bright field may be photographed at a magnification of 300,000, by applying an accelerating voltage of 100 kV.

Although the particle size can be measured directly by a vernier micrometer, etc., from the obtained TEM photograph image of the silver nanoparticles, the particle size can also be calculated by image software. In any case, the average primary particle size of the silver nanoparticles is calculated by measuring at least 200 independent particles in the TEM photograph, and averaging these particles.

<Silver Particles>

The silver particles constituting the bonding material of the present invention have the average particle size in a range of 0.5 to 10 μm, and preferably in a range of 0.5 to 9.0 μm, and further preferably in a range of 0.5 to 8.0 μm. The form of the silver particle is not particularly limited, and various forms such as a spherical shape, a flake (scale) shape, a rectangular solid shape, a cube shape, and an aggregate shape, can be used.

By using the silver particles of sub-micron order together with the above-mentioned silver nanoparticles, the bonding strength of the bonding material can be improved, and the bonding body having a high bonding force can be obtained. In a case of the bonding material, the silver particles may be added by 10 to 80 mass % and preferably 15 to 75 mass % with respect to a total paste mass.

The average primary particle size of the silver particles may be measured by a laser diffracting method. For example, 0.3 g of a sample of the silver particles is added into 50 mL of isopropyl alcohol, and a mixture is dispersed for 5 minutes by an ultrasonic wave cleaner at an output power of 50 W. The measurement is performed to the dispersion liquid and a value of $D_{50}$ (cumulative 50 mass % particle size) is measured by laser diffraction using a Microtrac particle size analyzer (9320-X100 by Honeywell-NIKKISO), and this value may be used as the average primary particle size.

<Flux>

The bonding material of the present invention is characterized in that a flux component (calcination promoting component) composed of an organic material is added. Here, specifically, the flux component is the organic material having two or more carboxyl groups. more preferably, the flux component is a dicarboxylic acid having an ether bond. By adding the flux component having the above-mentioned structure into the bonding material, the silver nanoparticles coated with the above-mentioned organic material, can be turned into a silver of a bulk body, even by applying heat treatment thereto at 500° C. or less under the inert gas atmosphere such as a nitrogen atmosphere.

When the above-mentioned heat treatment is applied, the flux component is preferably decomposed into a simple composition such as carbon dioxide or water, etc. Accordingly, the flux component is preferably the organic material composed of elements such as carbon, hydrogen, and oxygen only, with its decomposing temperature preferably set to not more than a setting temperature of the heat treatment. Specifically, the decomposing temperature is 500° C. or less, and more preferably 300° C. or less.

From this viewpoint, a molecular weight of the flux component is 1000 or less, and preferably 500 or less, and further preferably 300 or less. Further, the total carbon number in the composition is 15 or less, and preferably 10 or less. With such a level of the molecular weight and the carbon number, the flux component can be decomposed or vaporized even if the bonding temperature is set to relatively a low temperature.

As a preferable example of the organic material having two or more carboxyl groups being the flux component, glycolic acid being the organic material having a dicarboxylic acid structure, and further oxydiacetic acid (diglycol acid) being a dicarboxylic acid having the ether bond, can be given. At this time, an addition amount of the flux component is 0.01 to 1.0%, and preferably 0.02 to 0.7%, and further preferably 0.05 to 0.5% with respect to the total paste mass.

<Dispersion Medium>

The dispersion medium constituting the bonding material of the present invention is preferably a polar solvent having a low vapor pressure from the viewpoint of dispersing the silver nanoparticles. Note that in this case, the dispersion medium is not necessarily one kind to constitute the bonding material, and various kinds can be mixed together.

As a specific example, water, alcohol, polyol, glycol ether, 1-methylpyrrolidinone, pyridine, octanediol, terpineol, butyl carbitol, butyl carbitol acetate, texanol, phenoxy propanol, diethylene glycol monobutyl ether, dithylene glycol monobutyl ether acetate, γ-butyrolactone, ethylene glycol monomethyl ether acetate, ethylene glycol monoethyl ether acetate, methoxy butyl acetate, methoxy propyl acetate, dithyl glycol monoethyl ether acetate, ethyl lactate, and 1-octanol, etc., can be given. The addition amount of the solvent in the total paste (of course the total amount when two kinds or more are mixed) is 1 to 25%, preferably 3 to 20%, and further preferably 5 to 15% with respect to a total paste mass in consideration of printability.

<Other Additive Agent>

It is also preferable that the additive agent or a viscosity modifier capable of reducing a calcination temperature of the silver nanoparticles and accelerating adhesion of the silver nanoparticles, is added to the above-mentioned dispersion medium.

As examples of the viscosity modifier, a hydrocarbon solvent, each kind of fatty acids, water-dissolved resin, water-dispersed resin, and an inorganic binder, can be given. Specifically, a naphthene-based hydrocarbon solvent, oleic acid, acrylic resin, maleic acid, fumaric acid, and high acid value resin such as stylene/maleic acids, polyester resin, polyolefin resin, phenoxy resin, polyimide resin, polyimide resin, or vinyl acetate-based emulsion, acrylic emulsion, synthetic rubber latex, epoxy resin, phenol resin, DAP resin, urethane resin, fluororesin, silicone resin, ethyl cellulose, and polyvinyl alcohol, etc., can be added. As an example of the inorganic binder, silica sol, alumina sol, zirconiazol, titaniasol, etc., can be given.

By adding the viscosity modifier, an improvement effect in transferability and an improvement effect of so-called printability such as suppressing a blur, etc., can be expected when the paste is printed onto a substrate.

A small addition amount of such a viscosity modifier is preferable, from the viewpoint of improving the calcination. Therefore, a total amount of the additive agent of the viscosity modifier is preferably set to 0.2 to 2.0 mass %, preferably 0.3 to 1.5 mass %, and further preferably 0.3 to 1.0 mass % with respect to the total mass of the paste, in view of other component.

<Production of the Bonding Material (Paste)>

A method of producing the bonding material of the present invention will be described hereafter. The mixture is introduced to a kneader/deaerator and is kneaded, to thereby form a kneaded material. Thereafter, a mechanical dispersion is performed to the kneaded material, to thereby obtain the bonding material of the present invention.

In such a mechanical dispersion, any kind of a publicly-known method can be employed, provided that the silver nanoparticles and the silver particles are not remarkably modified. Specifically, ultrasonic dispersion, dispersant, three roll mill, ball mill, beads mill, two shafts kneader, and rotation and revolution type mixer, etc., can be given, and they can be used alone or by combining a plurality of them.

A metallizing temperature of the silver nanoparticles is largely varied in some cases, depending on the organic material or the dispersion agent that covers the surface of each silver nanoparticle, or the kind of additives. Therefore, in the produced bonding material, it is preferable to grasp a thermal property in advance by TG measurement (measurement with a thermobalance), etc.

<Formation of the Bonding Body>

The bonding body is formed by coating a substrate surface being the first bonded member on which a bonding part is formed, with the bonding material in a thickness of about 20 μm to 200 μm, by a metal mask, dispenser, or a screen print method for example. After coating, heat treatment at a low temperature (called auxiliary calcination hereafter) is applied thereto, and thereafter a bonded material being the second bonded member is stuck thereto, to thereby metallize the bonding material by the heat treatment at a high temperature (called full calcination hereafter).

The bonding material of the present invention is metallized even by the full calcination at 500° C. or less in the inert gas atmosphere such as a nitrogen atmosphere. However, the-above mentioned bonding material can be metallized even in a case of the full calcination in the atmosphere, similarly to a conventional producing method.

Here, if there are bubbles or gas is contained in the bonding material with which the substrate surface is coated, a void is thereby generated on the formed bonding layer. Therefore, in order to remove the bubbles or the gas in the bonding material, preferably the heat treatment is applied to the bonding material with which the substrate surface is coated as the auxiliary calcination, under a condition of a lower temperature than the decomposing temperature of the silver nanoparticles used for the bonding material, or a lower temperature than a temperature of a boiling point of the dispersion medium, to thereby remove the bubbles or the gas. By applying such an auxiliary calcination, the generation of the void can be inhibited which is generated on the bonding layer when the bonding body is formed, and as a result, the bonding strength of the bonding layer can be preferably increased.

Generally, the auxiliary calcination temperature is preferably set in a range of 50 to 150° C., and set to be lower than the temperature of the full calcination by 50 to 350° C. Although the auxiliary calcination time depends on its bonding target area, about 10 minutes heating is sufficient, and about 30 seconds heating is also acceptable in some cases.

By such an auxiliary calcination as described above, the generation of the void in the bonding layer can be inhibited even in a case that the auxiliary calcination is applied not only to the bonding material of the present invention, but also to the bonding material of the conventional technique.

After auxiliary calcination, the bonded material is disposed on an upper part of a coating layer of the bonding material. Then, in order to form the bonding body, the temperature is raised while pressurizing the bonded material onto the substrate. A pressurization force at this time can be suitably set, depending on the material to be bonded. However, the pressurization force is preferably set to 20 MPa or less and preferably 15 MPa or less, in consideration of an influence on the bonded material to be bonded and the substrate.

The temperature for forming the bonding layer in the full calcination is preferably set to a low temperature of 150° C. or more and 500° C. or less. Such a temperature in the full calcination can be suitably set depending on the kind of the bonded material to be bonded and the substrate. The rate of temperature rise in the full calcination is set to 0.1 to 2.0° C./second and preferably set to 0.2 to 1.5° C./second. By thus setting the rate of temperature rise, a dense bonding layer can be formed, and a stable bonding body can be obtained.

Further, a more firm bonding layer can be obtained, if the silver particles in the bonding layer are metallized by keeping the full calcination temperature for 60 minutes to 30 minutes.

EXAMPLES

The present invention will be more specifically described hereafter, with reference to examples.

Example 1

<Synthesis of the Silver Nanoparticles>

500 mL beaker was used, and 13.4 g of silver nitrate (by TOYO KAGAKU, INC.) was dissolved into 72.1 g of pure water, to thereby prepare a raw material liquid.

Meanwhile, 1.4 L of pure water was charged into 5 L beaker, and the temperature was raised to 40° C. while introducing nitrogen for 30 minutes and removing dissolved oxygen. Then, 17.9 g of sorbic acid (by Wako Pure Chemical Industries, Ltd.) was added into the pure water as a protective agent, and 2.8 g of 28% aqueous ammonia (by Wako Pure Chemical Industries, Ltd.) was added next as a stabilizing agent.

In the example and a comparative example hereafter, a reaction start time is selected as a point of adding the aqueous ammonia.

The ammonia added solution was continuously stirred, and 6.0 g of hydrous hydrazine (purity 80%: by Otsuka Chemical Co., Ltd.) was added as a reducing agent after elapse of 5 minutes from start of a reaction, to thereby prepare a reducing liquid. After elapse of 10 minutes from the start of the reaction, the raw material liquid with a liquid temperature adjusted to 40° C. was added into the reducing liquid at once to cause reaction, and the stirring was ended.

After end of the stirring, the silver nanoparticle aggregate coated with the sorbic acid was formed after aging for 30 minutes. Thereafter, a liquid in which the silver nanoparticle aggregate was formed, was filtered through a filter paper of No5C, and a recovery was washed by pure water, to thereby obtain the silver nanoparticle aggregate. The silver nanoparticle aggregate was dried in a vacuum drier at 80° C. for 12 hours, to thereby obtain a dry powder of the silver nanoparticle aggregate.

<Preparation of the Bonding Material>

45.0 g (the ratio in total silver was 50.00 mass %) of the silver nanoparticle aggregate dry powder coated with the sorbic acid (having the average primary particle size: 100 nm) was obtained as the silver nanoparticle powder, and 45.0 g (the ratio in the total silve was 50.00 mass %) of powder of a spherical silver particle (2-1C spherical silver powder: having average primary particle size of $(D_{50})$ 1.0 μm by DOWA Electronics Inc.), 0.05 g of oxydiacetic acid (diglycol acid (by Wako Pure Chemical Industries, Ltd.) as flux, and 9.95 g of octanediol (2-ethyl-1,3-hexanediol by Kyowa Hakko Chemical Inc.) as a dispersion medium, were mixed, to thereby obtain a mixture.

The mixture was kneaded by a kneader/deaerator (V-mini300 by EME Inc.) for 30 seconds (kneading condition/Revolution; 1400 rpm, Rotation; 700 rpm), and thereafter was passed through three rolls (22851 Norderstedt by EXACT Apparatebaus) five times, to thereby obtain the bonding material (paste) of example 1. Mixture of the bonding material of example 1 is shown in tables 1 and 2.

Note that a boiling point of the ocanediol is 244° C. and a flash point thereof is 135° C.

<Formation of the Bonding Member>

A metal mask (a thickness of the mask: 50 μmt) was prepared, and a surface of a copper substrate plated with silver was coated with the bonding material (paste) of example 1 by a manual print using a metal squeegee. A pattern has a square of 5.5 mm and a thickness of 50 μm.

The copper substrate coated with the bonding material thus obtained, was installed in a furnace (flip chip bonder M-90 DON-400 by HiSOL, Inc.), and was subjected to auxiliary calcination by being heated at 100° C. for 10 minutes in a nitrogen atmosphere (oxygen concentration: 500 ppm or less), to thereby remove bubbles and gas components in the bonding material.

After the auxiliary calcination, the copper substrate coated with the bonding material, was cooled to 25° C., and a chip (Si chip plated with silver having a square of 5 mm and a thickness of 0.3 mm) was mounted on the coating surface.

The copper substrate with the chip mounted thereon, was installed in the furnace again, pressurization of 10 MPa was added thereon, the temperature was raised to 250° C. at the rate of temperature rise of 1° C./second, and heat treatment was applied thereto as the full calcination after the temperature reached 250° C. and the copper substrate was retained in this state for 5 minutes, to thereby obtain the bonding body of example 1.

The bonding force of the obtained bonding body of example 1, was measured. Specifically, measurement was performed based on a method descried in "lead-free solder test method: Tensile and shearing test method of solder joint (Section 5)" JISZ-03918-5:2003. This is a method of horizontally pushing a bonded body (chip) bonded on the substrate, and measuring a force at the time of a fracture of a bonding surface which cannot withstand a pressing force. In this example, the test was conducted using a bond tester (series 4000) by SAGE Inc. The test was performed under conditions of a share height: 50 μm, rate of test: 5 mm/min, and temperature: room temperature.

As a result, it was found that the bonding strength (average share strength) between the substrate and the chip was 64.0 MPa in the bonding body of example 1. Note that in the shearing test method, the force (N) at the time of the fracture of the boding surface, was directly measured, and a value obtained by this method depends on the bonding area. Therefore, in order to standardize the measured share strength, the bonding strength (average share strength) was defined as a value (unit/MPa) obtained by dividing the measured force at the time of fracture, by the bonding area (5.0 mm×5.0 mm=25.0 mm in this case). The same thing can be said for the example and the comparative example described hereafter.

Further, a presence ratio of the void in the bonding body of example 1 was measured by X-ray measurement (Fluoroscopic apparatus SMX-160LT by SHIMADZU CORPORATION). Specifically, an image analyzing software was used to adjust a range of a brightness (range of color) so that a void portion are colored red, and the area having a square of 5 mm was binarized, to thereby calculate an area ratio of the void. Results thereof are shown in tables 1 and 2.

Example 2

The bonding material of example 2 was produced through the producing step similar to that of example 1, excluding a point that the addition amount of octanediol being a dispersion medium of the bonding material of example 1, was changed to 7.95 g, and further 2.0 g of EXXSOL D130 FLUID (by Exxon Mobil Corporation) was added for the purpose of adjusting viscosity. Then, the bonding body of example 2 was formed through the step similar to that of example 1, and evaluation was performed similarly to example 1. Results of the evaluation are shown in tables 1 and 2.

Example 3

The bonding material of example 3 was produced through the producing step similar to that of example 1, excluding a point that the silver powder of the bonding material of example 1 was changed from the spherical silver particle to a flake silver particle powder (FA-D-6 by DOWA Electronics Corporation, having an average primary particle size ($D_{50}$) of 8.3 μm). Then, the bonding body of example 3 was formed through the step similar to that of example 1, and evaluation was performed similarly to example 1. Results of the evaluation are shown in tables 1 and 2.

Example 4

The bonding material of example 4 was produced through the producing step similar to that of example 1, excluding a point that the silver nanoparticle aggregate dry powder (having an average primary particle size of 100 nm) coated with the sorbic acid in the bonding material of example 1, was changed to the silver nanoparticle aggregate dry powder (having an average primary particle size of 60 nm) coated with sorbic acid, and the addition amount of the oxydiacetic acid as flux (diglycol acid by Wako Pure Chemical Industries, Ltd.) was changed to 0.1 g, and the addition amount of the octanediol as a dispersion medium (2-ethyl-1,3-hexanediol by Kyowa Hakko Chemical Inc.) was changed to 9.9 g. Then, the bonding body of example 4 was formed through the step similar to that of example 1, and evaluation was performed similarly to example 1. Results of the evaluation are shown in tables 1 and 2.

Example 5

The bonding material of example 5 was produced through the producing step similar to that of example 1, excluding a point that the addition amount of the octanediol being a dispersion medium of the bonding material of example 1 was changed to 7.45 g, and 2.0 g of EXXSOL D130 FLUID (by Exxon Mobil Corporation) was added for the purpose of adjusting viscosity, and 0.5 g of oleic acid (by KISHIDA CHEMICAL Co., Ltd.) was added for the purpose of adjusting the viscosity. Then, the bonding body of example 5 was formed through the step similar to that of example 1, and evaluation was performed similarly to example 1. Results of the evaluation are shown in tables 1 and 2.

Comparative Example 1

The bonding material of example 1 was prepared.
Then, the chip was mounted on the copper substrate coated with the bonding material, without executing the auxiliary calcination before mounting the chip, then pressurization of 10 MPa was added thereon, and heat treatment was applied thereto at 100° C. for 10 minutes as the auxiliary calcination, and thereafter the temperature was raised to 250° C. at the rate of temperature rise of 1° C./second, and the copper substrate was retained in this state for 5 minutes as the full calcination after the temperature reached 250° C., to thereby obtain the bonding body of comparative example 1. Results of the evaluation are shown in tables 1 and 2.

Comparative Example 2

The bonding body of comparative example 2 was formed through the step similar to the step of comparative example 1, using the bonding material of example 2, and the evaluation similar to the evaluation of example 1 was conducted. Results of the evaluation are shown in tables 1 and 2.

Comparative Example 3

The bonding body of comparative example 3 was formed through the step similar to the step of comparative example 1, using the bonding material of example 3, and the evaluation similar to the evaluation of example 1 was conducted. The results of the evaluation are shown in tables 1 and 2.

TABLE 1

| | Silver nanoparticle | | Spherical silver particle powder | | | Flake-shaped silver particle powder | | | Flux | | Additive agent (adjustment of viscosity) | |
|---|---|---|---|---|---|---|---|---|---|---|---|---|
| | Particle size (nm) | Coating substance | Addition amount (g) | Particle size (μm) | Addition amount (g) | Ratio (%) | Particle size (μm) | Addition amount (g) | Ratio (%) | Kind | (*1) (g) | Kind | (*1) (g) |
| Example 1 | 100 | Solbic acid | 45.0 | 1.0 | 45.0 | 50.0 | — | — | — | Oxydiacetic acid | 0.05 | — | — |
| Example 2 | 100 | Solbic acid | 45.0 | 1.0 | 45.0 | 50.0 | — | — | — | Oxydiacetic acid | 0.05 | — | — |
| Example 3 | 100 | Solbic acid | 45.0 | — | — | — | 8.3 | 45.0 | 50.0 | Oxydiacetic acid | 0.05 | — | — |
| Example 4 | 60 | Solbic acid | 45.0 | 1.0 | 45.0 | 50.0 | — | — | — | Oxydiacetic acid | 0.1 | — | — |
| Example 5 | 100 | Solbic acid | 45.0 | 1.0 | 45.0 | 50.0 | — | — | — | Oxydiacetic acid | 0.05 | Oleic acid | 0.5 |
| (*2) 1 | 100 | Solbic acid | 45.0 | 1.0 | 45.0 | 50.0 | — | — | — | Oxydiacetic acid | 0.05 | — | — |
| (*2) 2 | 100 | Solbic acid | 45.0 | 1.0 | 45.0 | 50.0 | — | — | — | Oxydiacetic acid | 0.05 | — | — |
| (*2) 3 | 100 | Solbic acid | 45.0 | — | — | — | 8.3 | 45.0 | 50.0 | Oxydiacetic acid | 0.05 | — | — |

TABLE 2

| | Solvent (dispersion medium) | | Solvent (adjustment of viscosity) | | Bonding material | | Bonding step | Bonding body | |
|---|---|---|---|---|---|---|---|---|---|
| | Kind | Addition amount (g) | Kind | Addition amount (g) | Viscosity 5 rpm (Pa · s) | Metal concentration (Mass %) | Auxiliary calcination before mounting chip | Bonding strength (MPa) | Void ratio (%) |
| Example 1 | Octanediol | 9.95 | — | — | 109 | 89.5 | Executed | 64.0 | 0.01 |
| Example 2 | Octanediol | 7.95 | EXXSOL D130 | 2.0 | 81.6 | 89.5 | Executed | 58.0 | 0.18 |
| Example 3 | Octanediol | 9.95 | — | — | 57.1 | 89.5 | Executed | 49.6 | 0.25 |
| Example 4 | Octanediol | 9.9 | — | — | 171 | 89.5 | Executed | 56.0 | 0.17 |
| Example 5 | Octanediol | 7.45 | EXXSOL D130 | 2.0 | 57.4 | 89.5 | Executed | 53.0 | 0.15 |
| (*2) 1 | Octanediol | 9.95 | — | — | 109 | 89.5 | Not executed | 27.2 | 2.10 |
| (*2) 2 | Octanediol | 7.95 | EXXSOL D130 | 2.0 | 81.6 | 89.5 | Not executed | 22.7 | 2.63 |
| (*2) 3 | Octanediol | 9.95 | — | — | 57.1 | 89.5 | Not executed | 8.0 | 5.07 |

CONCLUSION

Figure 1:
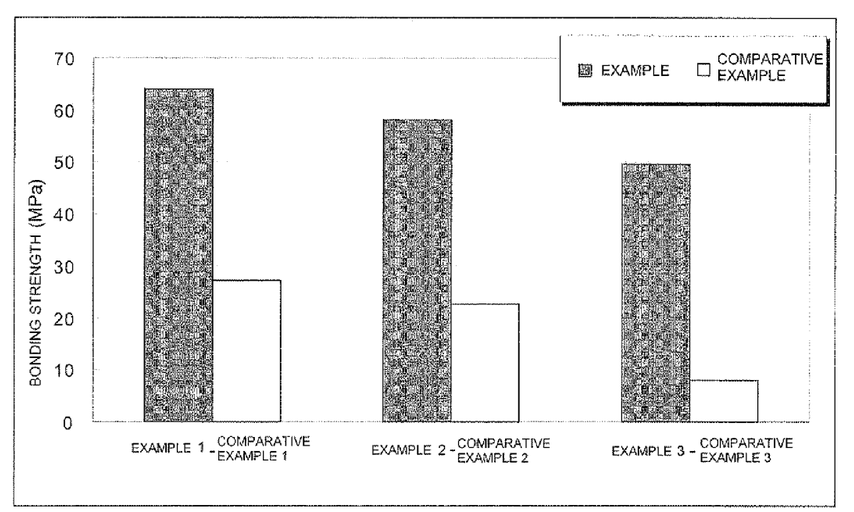
FIG. 1 is a graph showing a bonding strength of a bonding body according to an example and a comparative example.

FIG. 1 shows the bonding strength of the bonding body according to examples 1 to 3 and comparative examples 1 to 3. FIG. 1 is a bar graph in which the bonding strength (share strength) is taken on the vertical axis, and example 1 to comparative example 1, example 2 to comparative example 2, example 3 to comparative example 3 are taken on the horizontal axis.

Example 1 to comparative example 1, example 2 to comparative example 2, and example 3 to comparative example 3, show a case that the paste of the same composition is used as the bonding material, and examples 1 to 3 show a case that the auxiliary calcination is executed before mounting the chip, and comparative examples 1 to 3 show a case that the auxiliary calcination is not executed before mounting the chip.

From FIG. 1, it is found that the bonding body of examples 1 to 3 in a case of executing the auxiliary calcination before mounting the chip, has a stronger bonding strength of 2.3 to 6.2, than the bonding strength of the bonding body of comparative examples 1 to 2 in a case of not executing the auxiliary calcination.

INDUSTRIAL APPLICABILITY

The bonding material and the bonding body and the bonding method of the present invention can be applied to a noninsulated type semiconductor device, a technique of bare chip mounting assembly, a power device (IGBT, rectifier diode, power transistor, power MOSFET, Insulated Gate Bipolar Transistor, Thyristor, Gate turn-off thyistor, and TRIAC, and can also be applied to the bonding material bonded to a glass with its surface chrome-treated, and can also be applied to the bonding material for an electrode and a flame of an illumination device using LED.

The invention claimed is:

1. A bonding method of bonding a plurality of members, comprising:
   coating a bonding surface of a first member with a bonding material;
   applying auxiliary calcination to the first member coated with the bonding material, by heating the first member coated with the bonding material to 50° C. or more and 150° C. or less for 30 seconds or more and 10 minutes or less;
   cooling the first member coated with the bonding material after the auxiliary calcination;
   setting a second member on a layer of the bonding material with which the cooled first member is coated; and
   applying full calcination to the first member on which the second member is set, by applying heat treatment thereto to a higher temperature than the temperature of the auxiliary calcination with pressurization of 20 MPa or less added onto bonding surfaces of the first member and the second member, to thereby form a bonding layer between the first member and the second member,
   wherein the bonding material comprises silver nanoparticles coated with a fatty acid having a carbon number of 8 or less and having an average primary particle size of 1 nm or more and 200 nm or less, silver particles having an average particle size of 0.5 um or more and 10 um or less, an organic material having two or more carboxyl groups, and a dispersion medium.

2. The bonding method according to claim 1, wherein the organic material having two or more carboxyl groups has an ether bond.

3. The bonding method according to claim 1, wherein the organic material having two or more carboxyl groups is an oxydiacetic acid.

4. The bonding method according to claim 1, wherein the silver nanoparticles are coated with a fatty acid having a carbon number of 3 or more and 6 or less.

5. The bonding method according to claim 1, wherein the full calcination is performed in an inert gas atmosphere.

6. The bonding method according to claim 1, wherein the full calcination is performed at a temperature of 150° C. or more and 500° C. or less.

7. The bonding method according to claim 1, wherein a rate of heating temperature rise is set to 0.1° C./second or more and 2.0° C./second or less in the full calcination.

8. The bonding method according to claim 1, wherein the bonding material is a paste comprising the silver nanoparticles.

* * * * *